(12) United States Patent
Rupp

(10) Patent No.: US 11,258,437 B2
(45) Date of Patent: Feb. 22, 2022

(54) SWITCHING DEVICE FOR DISCONNECTING A CURRENT PATH

(71) Applicants: Siemens Aktiengesellschaft, Munich (DE); Michaela Langheld; Stephanie Langheld; Anja Langheld

(72) Inventor: Jürgen Rupp, Erlangen (DE)

(73) Assignee: SIEMENS ENERGY GLOBAL GMBH & CO. KG, Munich (DE)

( * ) Notice: Subject to any disclaimer, the term of this patent is extended or adjusted under 35 U.S.C. 154(b) by 203 days.

(21) Appl. No.: 16/488,750

(22) PCT Filed: Feb. 27, 2018

(86) PCT No.: PCT/EP2018/054775
§ 371 (c)(1),
(2) Date: Aug. 26, 2019

(87) PCT Pub. No.: WO2018/158233
PCT Pub. Date: Sep. 7, 2018

(65) Prior Publication Data
US 2021/0135664 A1    May 6, 2021

(30) Foreign Application Priority Data
Feb. 28, 2017   (EP) .................................... 17158392

(51) Int. Cl.
*H03K 17/0814* (2006.01)
*H03K 17/16* (2006.01)
*H03K 17/56* (2006.01)
(52) U.S. Cl.
CPC ....... *H03K 17/0814* (2013.01); *H03K 17/162* (2013.01); *H03K 17/56* (2013.01)

(58) Field of Classification Search
CPC . H01L 27/00; H01L 27/0251; H01L 27/0255; H01L 27/0262; H01L 27/0266;
(Continued)

(56) References Cited

U.S. PATENT DOCUMENTS

2013/0009491 A1\* 1/2013 Hafner .................. H02M 1/092
307/113

FOREIGN PATENT DOCUMENTS

DE   103 50 361 A1   6/2005   .......... H03K 17/082
EP   3 032 733 A1    6/1916   ........... H02M 7/487
(Continued)

OTHER PUBLICATIONS

Search Report for International Application No. PCT/EP2018/054775, 16 pages, dated Jul. 12, 2018.
(Continued)

*Primary Examiner* — Lincoln D Donovan
*Assistant Examiner* — Dave Mattison
(74) *Attorney, Agent, or Firm* — Slayden Grubert Beard PLLC

(57) ABSTRACT

Various embodiments include a switching device for disconnecting a current path in a DC supply system, said current path comprising inductances at the source end and the load end, the switching device comprising: two series-connected switching modules; wherein each of the series-connected switching modules comprises a controllable semiconductor switching element and a series circuit; the series circuit including a resistor and a capacitor connected in parallel to the controllable semiconductor switching element.

14 Claims, 6 Drawing Sheets

(58) Field of Classification Search
CPC .......... H02H 9/00; H02H 9/046; H03K 17/00;
H03K 17/0814; H03K 17/08148; H03K
17/162; H03K 17/168; H03K 17/56
USPC .......................................................... 361/56
See application file for complete search history.

(56) References Cited

FOREIGN PATENT DOCUMENTS

| EP | 2264894 A1 | 12/2010 | ......... H03K 17/0814 |
|----|------------|---------|------------------------|
| JP | 09284110 A | 10/1997 | ............. H03K 17/08 |
| WO | 2011/095212 A2 | 8/2011 | ............. H02M 1/092 |

OTHER PUBLICATIONS

Search Report for EP Patent Application No. 17158392.5, 11 pages, dated Nov. 9, 2017.
Korean Notice of Allowance, Application No. 2019-7028369, 3 pages, dated Dec. 8, 2020.

* cited by examiner

SWITCHING DEVICE FOR DISCONNECTING A CURRENT PATH

CROSS-REFERENCE TO RELATED APPLICATIONS

This application is a U.S. National Stage Application of International Application No. PCT/EP2018/054775 filed Feb. 27, 2018, which designates the United States of America, and claims priority to EP Application No. 17158392.5 filed Feb. 28, 2017, the contents of which are hereby incorporated by reference in their entirety.

TECHNICAL FIELD

The present disclosure relates to switches. Various embodiments may include switching devices for disconnecting a current path in a DC supply system, said current path comprising inductances at the source end and the load end.

BACKGROUND

A switching device for disconnecting a current path in a DC supply system, said current path comprising inductances at the source end and the load end, must be capable of accommodating the recovery or removal of energy from the DC supply system. If, as in the case of "ABB switches", mechanical switches are employed, there is a resulting risk of the generation of an arc, as it cannot be ensured that the disconnection of the current path will coincide with a zero-crossing of the current. A mechanical switching element of this type must therefore be protected by a complex circuit, e.g. by the provision of a plurality of semiconductor switching elements and varistors as voltage surge limiters.

To this end, for example, the high-speed mechanical switch arranged in the main current branch can be interconnected with a semiconductor switching element which, in the conducting state, undergoes a low voltage drop. The function of this semiconductor switching element, upon the interruption of the load path, is to generate a voltage drop upon disconnection, such that the current can be routed to a main switch which is connected in parallel with this arrangement. This main switch is comprised of a series-connected arrangement of a plurality of semiconductor switching elements, for the voltage surge protection of which a varistor is parallel-connected in each case. If current now flows essentially via the parallel path, the high-speed mechanical switch can be disconnected without generating an arc. A disadvantage of this switching device is the complexity thereof, associated with the plurality of semiconductor switching elements and varistors required, wherein the latter are extremely expensive and cumbersome.

Some switching devices are exclusively comprised of controllable semiconductor switching elements, e.g. IGBTs. In variants of this type, for example, two semiconductor switching elements can be connected in the load path in an anti-series arrangement. In the absence of further measures, however, this switching device can only be employed in DC supply systems which do not feature any large inductances. Moreover, voltage-limiting components such as e.g. varistors and the like are required, the use of which, however, is not favored, on the grounds of cost.

"Hybrid switches", such as the "Marquardt switch" which, upon disconnection, generate an artificial current zero-crossing by the imposition of a reverse current. Given that, in normal duty, no semiconductor switching element is present in the current path, losses in this type of hybrid switch can be restricted to a very low level. The switching speed is dependent upon a mechanical switching element which is provided in the hybrid switch.

One problem associated with the above-mentioned types of switching devices is the energy to be removed from system inductances. Upon rapid disconnection, high voltages are generated, which must be removed by means of a protective circuit in order to prevent damage to the components of the switching device. None of the above-mentioned variants resolves this problem in a satisfactory manner, with respect to technical functionality and cost-effectiveness.

SUMMARY

The teachings of the present disclosure include switching devices for disconnecting a current path in a DC supply system, said current path comprising inductances at the source end and the load end, which is structurally and/or functionally improved. Specifically, it is intended that the provision of the switching device should be associated with lower costs. For example, some embodiments include a switching device (1) for disconnecting a current path (6) in a DC supply system, said current path (6) comprising inductances (3, 5) at the source end and the load end, which comprises at least two series-connected switching modules (10), wherein each of the switching modules (10) comprises at least one controllable semiconductor switching element (13, 16), to which a series circuit consisting of a resistor (14) and a capacitor (15) is connected in parallel.

In some embodiments, the parallel-connected arrangement of the at least one controllable semiconductor switching element (13, 16) and the series-connected arrangement of the resistor (14) and the capacitor (15) is interconnected between a first switching module terminal (11) and a second switching module terminal (12) of the respective switching module (10).

In some embodiments, the parallel-connected arrangement of the at least one controllable semiconductor switching element (13, 16) and the series-connected arrangement of the resistor (14) and the capacitor (15) is interconnected between a first rectifier terminal (25) and a second rectifier terminal (26) of a rectifier bridge (20) of the respective switching module (10), wherein the first rectifier terminal (25) is a first node point of the rectifier bridge (20), on which the cathode terminals of two rectifier components (21, 23) are mutually interconnected, and wherein the second rectifier terminal (26) is a second node point (26) of the rectifier bridge (20), on which the anode terminals of two further rectifier components (22, 24) are mutually interconnected.

In some embodiments, in the operation of the switching device (1) for disconnecting the current path (6), pending the clearance of the energy stored in the inductances (3, 5), at a given time point, the controllable semiconductor switching element (13, 16) of at least one switching module (10) is switched to a blocking state.

In some embodiments, in the operation of the switching device for disconnecting the current path (6), pending the clearance of the energy stored in the inductances (3, 5), at a given time point, the controllable semiconductor switching element (13, 16) of a first partial number of switching modules (10) is switched to a blocking state, and a second partial number of switching modules (10) is switched to a conducting state.

In some embodiments, in the operation of the switching device for disconnecting the current path (6), pending the clearance of the energy stored in the inductances (3, 5), the controllable semiconductor switching element (13, 16) of that or those switching module(s) (10) is switched to a conducting state, across the capacitor(s) (15) of which the voltage achieves a predefined upper threshold value.

In some embodiments, in the operation of the switching device for disconnecting the current path (6), pending the clearance of the energy stored in the inductances (3, 5), the controllable semiconductor switching element (13, 16) of that or those switching module(s) (10) is switched to a blocking state, across the capacitor(s) (15) of which the voltage achieves a predefined lower threshold value.

In some embodiments, in the operation of the switching device for disconnecting the current path (6), pending the clearance of the energy stored in the inductances (3, 5), the controllable semiconductor switching element (13, 16) of that or those switching module(s) (10) is permanently switched to a blocking state, if, via the capacitor(s) (15) thereof, the voltage no longer achieves the predefined threshold value.

In some embodiments, in the operation of the switching device for disconnecting the current path (6), pending the clearance of the energy stored in the inductances (3, 5), at a given time point, the controllable semiconductor switching element (13, 16) of the switching module (10) is switched to a conducting state, on the capacitor (15) of which the highest voltage is present, in comparison with the voltages on the capacitors (15) of the remaining switching modules (10).

In some embodiments, in the operation of the switching device for disconnecting the current path (6), pending the clearance of the energy stored in the inductances (3, 5), the semiconductor switching elements are respectively switched on and off in an alternating manner.

In some embodiments, in the operation of the switching device for disconnecting the current path (6), pending the clearance of the energy stored in the inductances (3, 5), the semiconductor switching elements of different switching modules (10) are switched on and off at different time points.

In some embodiments, in the path of the controllable semiconductor switching element of a respective switching module (10), a further controllable semiconductor switching element (13, 16) is interconnected in an anti-series arrangement with the controllable semiconductor switching element (13, 16).

In some embodiments, the controllable semiconductor switching element (13, 16) is an interruptible semiconductor switching element (13, 16), specifically an IGBT, a MOSFET, an IGCT or a thyristor having a cut-off device.

In some embodiments, the latter is provided for use in a DC supply system having a voltage greater than 1,000 V.

BRIEF DESCRIPTION OF THE DRAWINGS

The teachings herein are described in greater detail hereinafter, with reference to the exemplary embodiments represented in the drawing. In the drawings.

DETAILED DESCRIPTION

Figure 1:
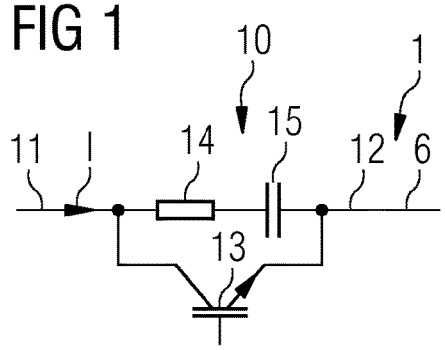
FIG. 1 shows an equivalent electric circuit diagram representing the layout of an individual unidirectional switching module for a switching device according to the invention.

In some embodiments, there is switching device for disconnecting a current path in a DC supply system, said current path comprising inductances at the source end and the load end, which comprises at least two series-connected switching modules. Each of the switching modules comprises at least one controllable semiconductor switching element, to which a series circuit consisting of a resistor and a capacitor is connected in parallel.

A switching device of this type permits a "soft" switching process, wherein the current flux in the current path is not reduced abruptly but declines with a ramped characteristic. By means of at least one of the at least two switching modules, a counter-voltage is constituted in the current path. This is made possible by the operation of the respective semiconductor switching element of the switching modules in the switched-mode domain. Accordingly, the high power loss in the event of a switch-off is not implemented in the semiconductor switching element of the respective switching modules, but primarily in the resistor of the respective switching modules.

Voltage-limiting components, such as varistors, which are expensive, heavy and cumbersome, can thus be omitted from the switching device. The semiconductor switching element in the respective switching modules thus assumes the function of a brake chopper. At the same time, the respective capacitor of the switching modules can be dimensioned to a lower rating, as it is not required to accommodate the entire quantity of energy stored in the inductances at the source end and the load end, but only a small proportion thereof, on the grounds of the switched-mode operation of the semiconductor switching element of the relevant switching modules. Accordingly, the total energy to be removed is not limited by the semiconductor switching element of the relevant switching modules. The switch-off process is simply prolonged, in the event of larger inductances at the source end and the load end.

An application of the switching device is specifically possible in ships, specifically in the medium-voltage DC systems thereof. A high-speed and secure DC switch permits reliable disconnection of DC zones, for example in the event of flooding or other switch-off scenarios. In general, this also applies to the operation of other separate networks, in which different zones must remain securely and rapidly disconnectable.

In some embodiments, the parallel-connected arrangement of the at least one controllable switching element and the series-connected arrangement of the resistor and the capacitor is interconnected between a first switching module terminal and a second switching module terminal of the respective switching module. A plurality of series-interconnected switching modules can then be interconnected such that a first switching module terminal of one switching module is interconnected with the second switching module terminal of a preceding switching module. The first switching module terminal of a first switching module is interconnected via a source-end inductance with a DC voltage source, and a second switching module terminal of a final switching module of the plurality of switching modules is interconnected, via a load-end inductance, with a load. A switching module of this type, wherein at least one controllable semiconductor element, a resistor and a capacitor are provided, is configured with a minimum number of components.

In some embodiments, the parallel-connected arrangement of exactly one controllable semiconductor switching element and the series-connected arrangement of the resistor and the capacitor (the "base module") is interconnected between a first rectifier terminal and a second rectifier terminal of a rectifier bridge of the respective switching module. The first rectifier terminal is a first node point of the rectifier bridge, on which the cathode terminals of two rectifier components are mutually interconnected. The second rectifier terminal is a second node point of the rectifier bridge, on which the anode terminals of two further rectifier components are mutually interconnected. If a unidirectional base module, i.e. a switching module comprising only a single semiconductor switching element, is provided in the rectifier bridge, the switching module can be employed for both current directions. A current reversal is achieved by means of the rectifier bridge which, in the simplest case, is a diode bridge.

In some embodiments, any number of switching modules can be connected in series. Series connection is executed such that a third rectifier terminal of a switching module is interconnected with a fourth rectifier terminal of a preceding switching module. The third rectifier terminal is a third node point of the rectifier bridge, on which a cathode terminal of a rectifier component and an anode terminal of another rectifier component are mutually interconnected. In a corresponding manner, the fourth rectifier terminal is a fourth node point of the rectifier bridge, on which a cathode terminal of a rectifier component and a cathode terminal of another rectifier component are mutually interconnected.

In some embodiments, in the operation of the switching device for disconnecting the current path, pending the clearance of the energy stored in the source-end and load-end inductances, at a given time point, the controllable semiconductor switching element of at least one switching module is switched to a blocking state. It can thus be prevented that, e.g. in the event of a disconnection operation in response to a load-end short-circuit, the short-circuit current can continue to be constituted via the switching device.

In some embodiments, in the operation of the switching device for disconnecting the current path, pending the clearance of the energy stored in the inductances, at a given time point, the controllable semiconductor switching element of a first partial number of switching modules is switched to a blocking state, and a second partial number of switching modules is switched to a conducting state. The total number of switching modules switched to a conducting state and a blocking state can be coordinated by a superordinate control device or can be determined with reference to voltage levels which are set in the respective switching modules.

In some embodiments, in the operation of the switching device for disconnecting the current path, pending the clearance of the energy stored in the inductances, the controllable semiconductor switching element of that or those switching module(s) is switched to a conducting state, across the capacitor(s) of which the voltage achieves a predefined upper threshold value. With the switching device switched to a blocking state, at a given time point, at least one switching module is switched to a blocking state. In other words, the controllable semiconductor switching element of the relevant switching module is switched to a blocking state. Accordingly, the current in this switching module can only continue to flow via the parallel path of the RC element. As a result, the capacitor of the RC element will only be charged until the voltage achieves the predefined upper threshold value. Thereafter, the controllable semiconductor switching element of this switching module switches back to a conducting state, such that the capacitor can be discharged via the series-connected resistor.

In some embodiments, in the operation of the switching device for disconnecting the current path, pending the clearance of the energy stored in the inductances, the controllable semiconductor switching element of that or those switching module(s) is switched to a blocking state, across the capacitor(s) of which the voltage achieves a predefined lower threshold value. Immediately after the lower threshold value is achieved, the controllable semiconductor switching element of the relevant switching module switches back to a conducting state. In the event of load disconnection in response to a short-circuit, by this method, the short-circuit connection is restored for a short time. However, as this only occurs for a short time, the current is cleared in the means, as the source-end and load-end inductances prevent an excessively rapid rise.

In some embodiments, in the operation of the switching device for disconnecting the current path, pending the clearance of the energy stored in the inductances, the controllable semiconductor switching element of that or those switching module(s) is permanently switched to a blocking state, if, via the capacitor(s) thereof, the voltage no longer achieves the predefined upper threshold value. The voltage can thus oscillate with a natural resonance.

In some embodiments, in the operation of the switching device for disconnecting the current path, pending the clearance of the energy stored in the inductances, at a given time point, the controllable semiconductor switching element of the switching module is switched to a conducting state, on the capacitor of which the highest voltage is present, in comparison with the voltages on the capacitors of the remaining switching modules. According to this configuration, for the disconnection of a controllable semiconductor switching element, no upper threshold value is determined. Instead, the voltages on the capacitors of all the switching modules are determined separately and are mutually compared. The controllable semiconductor switching element of that switching module, across the capacitor of which the highest voltage is present, is then switched to a conducting state. It is thus ensured that no overloading of the controllable semiconductor switching element of a respective switching module can occur, even in the event of high overvoltages. This also provides a certain random quality, with respect to the switching state assumed by any switching module at any given switching time point.

In some embodiments, in the operation of the switching device for disconnecting the current path, pending the clearance of the energy stored in the inductances, the semiconductor switching elements are respectively switched on and off in an alternating manner. This means that each controllable semiconductor switching element is independently switched on and off in an alternating manner. As a result, the RC element of a corresponding switching module can assume switched-mode operation.

In some embodiments, in the operation of the switching device for disconnecting the current path, pending the clearance of the energy stored in the inductances, the semiconductor switching elements of different switching modules are switched on and off at different time points. It is thus ensured that, at any given time point, at least one switching module (or the controllable semiconductor switching element thereof) is in a blocking state.

In some embodiments, in the circuit path of the controllable semiconductor switching element of a respective switching module, a further controllable semiconductor switching element is interconnected in an anti-series arrangement with the controllable semiconductor switching element. A bidirectionally operable switching module is thus provided such that, as a result, the switching device can interrupt the current path, independently of the prevailing current direction.

In some embodiments, the controllable semiconductor switching element is an interruptible semiconductor switching element. Specifically, as controllable semiconductor switching elements, an IGBT, a MOSFET, an IGCT or a thyristor having a cut-off device (or "quenching circuit") can be employed.

The switching device described may be used in a DC supply system having a voltage greater than 1,000 V. Specifically, the switching device can be employed in high-voltage DC power transmission lines. Depending upon the prevailing voltage in the DC supply system, an appropriate corresponding number of switching modules for the switching device must then be selected. The higher the prevailing voltage in the DC supply system, the greater the number of switching modules selected will be—subject to the provision of identical semiconductor switching elements. For DC supply systems in the medium-voltage range, IGBTs or MOSFETs can specifically be employed. At higher voltages, thyristors having a cut-off device or IGCTs can specifically be employed. According to a further configuration, it is provided that the switching device of the type described here is employed as a short-circuit-proof power switch.

In the following description, identical components are identified by the same reference symbols.

FIG. 1 shows the schematic layout of a switching module 10 of a switching device 1 incorporating teachings of the present disclosure for disconnecting a current path 6 having source-end and load-end inductances. The switching module 10 comprises a controllable semiconductor switching element 13. The controllable semiconductor switching element 13 can be an IGBT, a MOSFET, an IGCT or a thyristor having a cut-off device. The load terminals of the controllable semiconductor switching element 13 are interconnected between a first switching module terminal 11 and a second switching module terminal 12. Between the first and the second switching module terminals 11, 12, a series-connected arrangement of a resistor 14 and a capacitor 15 is further arranged. In other words, an RC element constituted by the resistor 14 and the capacitor 15 is connected in parallel with the load terminals of the controllable switching element 13.

In principle, the mode of operation of such an individual switching module of the switching device 1 is as follows: if the switching device 1 is to conduct current, the controllable semiconductor switching element 13 is switched to a conducting state. Immediately after the current path 6 is to be interrupted by means of the switching device 1, the controllable semiconductor switching element 13 is switched to a blocking state, by means of a control device which is not represented in the figures. As a result, the current I flowing in the current path 6 can only continue to flow via the RC element constituted by the resistor 14 and the capacitor 15. The capacitor 15 is charged by the current I flowing therein, until a predefined upper threshold value for the voltage across the latter is achieved.

To this end, a corresponding measuring device (not represented) can be provided in the switching module 10. Immediately after the predefined upper threshold value is achieved, the controllable semiconductor switching element 13 is switched back to a conducting state. The capacitor 15 can thus be discharged via the resistor 14. Immediately after a predefined lower threshold value for the voltage across the capacitor 15 is achieved, the controllable semiconductor switching element 13 is switched back to a conducting state, by means of its control device.

Figure 3:
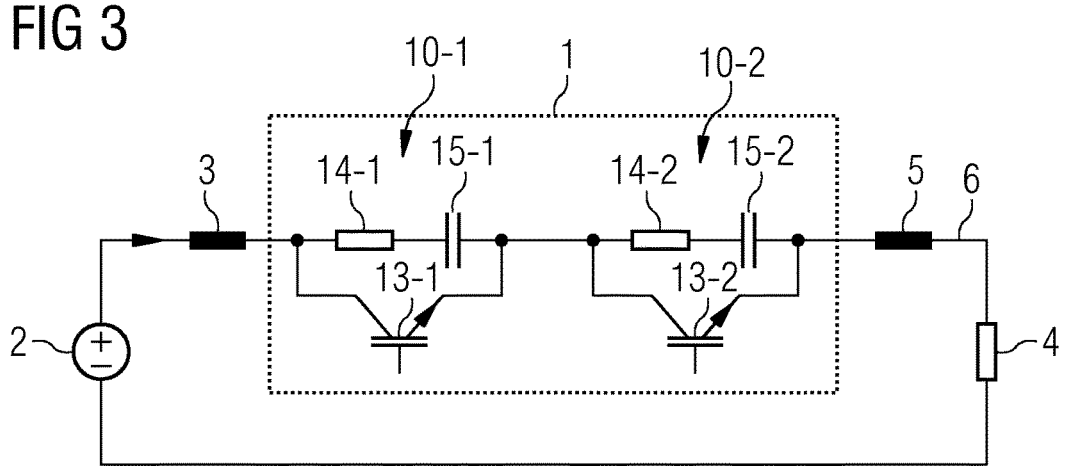
FIG. 3 shows an equivalent electric circuit diagram of a switching device incorporating teachings of the present disclosure in a DC supply system having source-end and load-end inductances.

If the disconnection of the current path 6 occurs, for example, in response to a short-circuit in the DC supply system, reclosing (switching of the controllable semiconductor switching element 13 to a conducting state) permits the restoration of the flow of short-circuit current via the switching module 10. However, as the switch-on time of the controllable semiconductor switching element 13 is very short, the current I flowing in the current path 6 is cleared by the means as the source-end and load-end inductances 3 and 5 (c.f. FIG. 3), which are not represented in FIG. 1, prevent an excessively rapid rise in current.

Were the switching device 1 to be constituted of a single switching module 10 only, as represented in FIG. 1, voltage control would be restricted to voltages which are lower than the maximum voltage of the controllable semiconductor switching element 13. In the event of higher voltages, associated with a high-speed disconnection process and the occurrence of an overvoltage associated with the presence of inductances in the current path, the controllable semiconductor switching element 13 might be destroyed. Although, in principle, the provision of a single switching module 10 in the switching device 1 is possible, this may only be appropriate when the DC supply system incorporates high impedances.

Figure 2:
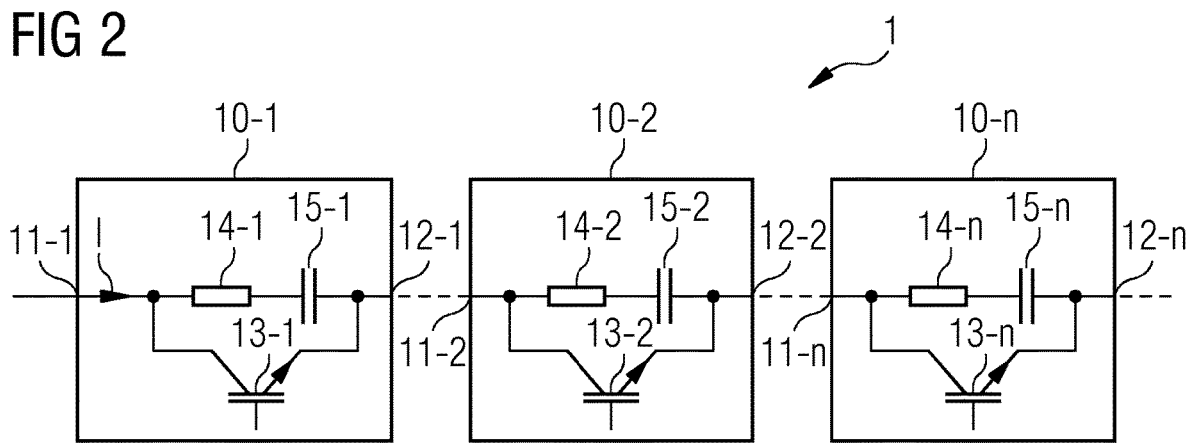
FIG. 2 shows an equivalent electric circuit diagram of a series-connected arrangement of three of the switching modules represented in FIG. 1.

In order to permit the disconnection of a current path on a DC supply system having high voltages by means of the switching device 1, according to FIG. 2, the series interconnection of a plurality of switching modules as represented in FIG. 1 is therefore provided. FIG. 2 shows an equivalent electric circuit diagram of a series-connected arrangement of n switching modules 10-1, 10-2, . . . , 10-n (in general: 10-$i$, where i=1 to n). Each of the switching modules 10-$i$ is constituted in the manner described in FIG. 1. Serial interconnection of the switching modules 10-$i$ is executed such that the second switching module terminal 12-1 of the first switching module 10-1 is connected to the first switching module terminal 11-2 of the next switching module 10-2 in sequence, and so forth. The first switching module terminal 11-1 of the first switching module 10-1, as represented in FIG. 3, is connected to a DC voltage source 2 via a source-end inductance 3. The DC voltage source 2, for example, can be an energy generating unit such as, e.g., a photovoltaic installation, a storage system, a battery charging device, a wind energy installation, a rectifier and the like. The second switching module terminal 12-$n$ of the final switching module 10-$n$, as represented in FIG. 3, is interconnected with a load 4 via a load-end inductance 6. The load 4 can be, for example, a drive system on a DC supply system, or similar.

FIG. 3 shows the equivalent electric circuit diagram of a switching device 1, which is comprised of two mutually series-connected switching modules 10-1 and 10-2, each of which is constituted as described in FIG. 1. The switching device 1 is connected to the DC voltage source 2 via the above-mentioned source-end inductance 3. On the output side, the switching device 1 is connected to the load 4 via the load-end inductance 5. The source-end and load-end inductances 3, 5 do not necessarily need to constitute physical components of the DC supply system. The source-end and load-end inductances 3, 5 can also be line inductances.

The mode of operation of the switching device represented in FIG. 3 is as follows: if the load 4 is to be supplied with current from the DC voltage source 2, the controllable semiconductor switching elements 13-1, 13-2 (in general: 13-$i$, where i=1 to 2) of the switching modules 10-1, 10-2 (in general: 10-$i$, where i=1 to 2) are switched to a conducting state. Immediately the current path 6, e.g. on the grounds of a load-side short-circuit, is to be interrupted, both the controllable semiconductor switching elements 13-$i$ are firstly switched to a blocking state, such that the current I can only continue to flow via the two RC elements of the switching modules 10-$i$. The capacitors 15-1, 15-2 (in general: 15-$i$, where i=1 to 2) are charged, until a respective predefined upper threshold value is achieved. The same or a different predefined upper threshold value can be selected for both capacitors 15-$i$. Initially, one of the controllable semiconductor switching elements 13-1 or 13-2 of the switching module 10-1 or 10-2 is switched back to a conducting state, such that the associated capacitor 15-1 or 15-2 is discharged via the series-connected resistor 14-1 or 14-2. Immediately after a predefined lower threshold value is achieved, the corresponding controllable semiconductor switching element is switched back to a blocking state. Simultaneously, or with a short temporal offset thereafter, the other controllable semiconductor switching element 13-2 or 13-1 is switched to a conducting state, if its predefined upper threshold value has been achieved. Accordingly, the two controllable semiconductor switching elements 13-1, 13-2 are switched to a conducting state in an alternating manner, thus ensuring that a total voltage $U_{ges}$ is present across both the controllable semiconductor switching elements 13-$i$ in combination, by means of which the current flux, and thus the energy stored in the inductances 3, 5, is cleared.

Unlike in the case of the application of a single switching module, in the case of a plurality of switching modules, a counter-voltage (i.e. a voltage which is oriented in opposition to the voltage direction of the DC voltage source 2) is consistently present in the DC supply system. If the number n of series-connected switching modules is very large, the short-term short-circuiting of one switching module is scarcely of any significance, as a result of which the current is cleared gradually.

Immediately after the predefined upper switching threshold in all the controllable semiconductor switching elements 13-$i$ is no longer achieved, all the controllable semiconductor switching elements 13-$i$ of the switching modules 10-$i$ will remain permanently blocked. The voltage in the DC supply system will then oscillate with a natural resonance.

The method described, independently of the magnitude of the number n of series-connected switching modules, is executed in a corresponding manner. Which of the controllable semiconductor switching elements 13-$i$, at any given time point, is in a blocking state, and which of the other controllable semiconductor switching elements 13-$i$ are switched to a conducting state, can be effected by means of deliberate control of the above-mentioned, but unrepresented control unit. Likewise, by means of the appropriate and differing selection of respective upper switching thresholds, the temporal characteristic of the switch-on and switch-off of the associated controllable semiconductor switching element can be influenced.

In some embodiments, the voltage present across the respective capacitors 15-$i$ can be monitored by corresponding measuring means (not represented). The controllable semiconductor switching element assigned to the capacitor on which the highest voltage is present is switched, in this case, to a conducting state, until the predefined lower threshold value is achieved. Given that, consistently, at different time points, different switching modules or the capacitors thereof have the maximum voltage, the switch-on and switch-off of the controllable semiconductor switching elements 13-$i$ of the switching modules 10-$i$ occurs in a more or less randomized manner.

Figure 4:
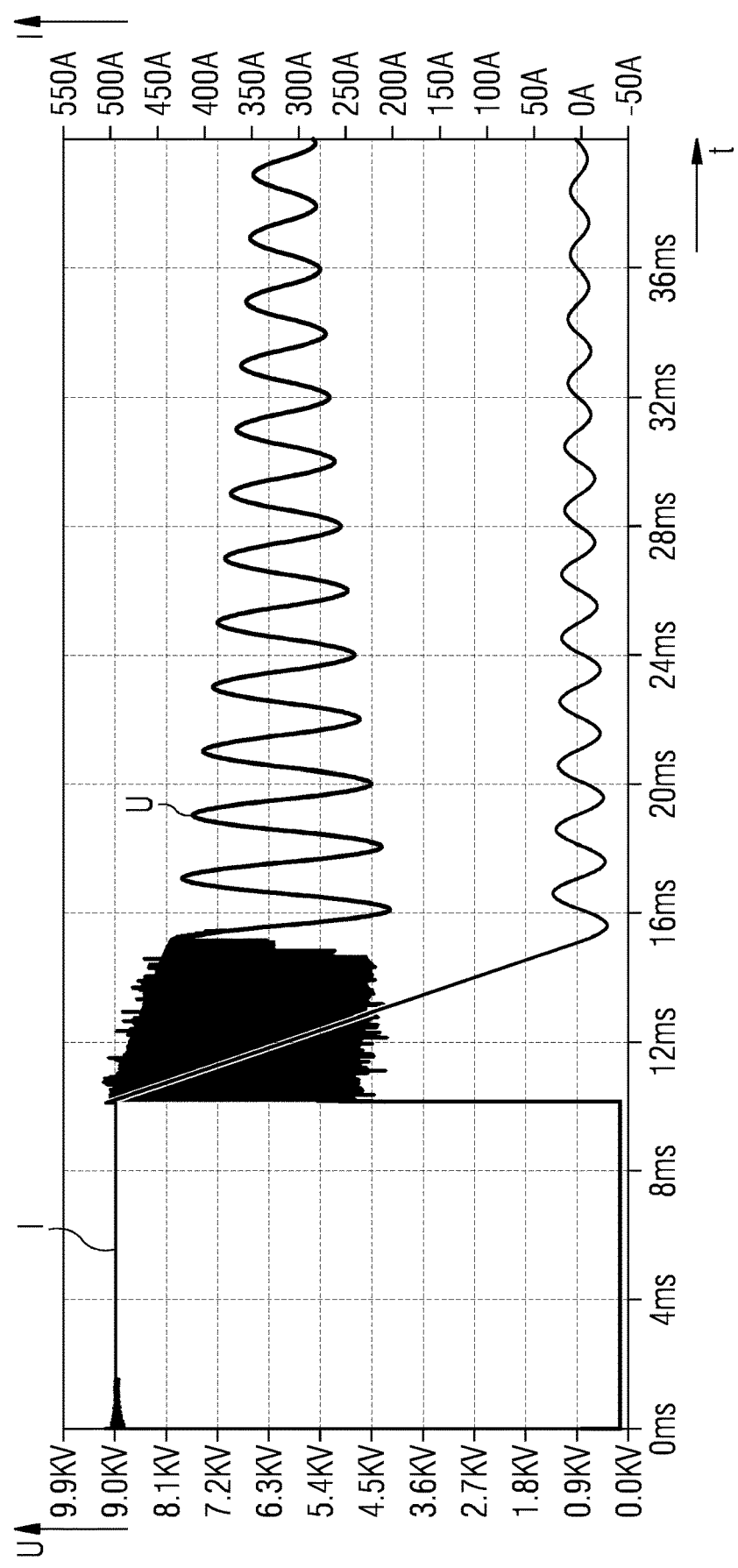
FIG. 4 shows a diagram representing the temporal voltage and current characteristic associated with a disconnection process on the switching device incorporating teachings of the present disclosure, having two switching modules.

FIG. 4 shows a temporal characteristic of the voltage U and the current I of a switching device 1, which comprises two switching modules 10. In the diagram represented in FIG. 4, a rated voltage of 6 kV and a current of 500 A are assumed. In the embodiment represented, the source-end and the load-end inductance respectively constitute 10 mH. It can clearly be seen that, at a time point t=10 ms, the disconnection of the current path is executed. Up to this time point, the current remains constant at I=500 A. The voltage U, which drops across the control device 1 prior to disconnection, is dictated by the conducting-state power losses of the controllable semiconductor switching element 13. In response to disconnection at time point t=10 ms, the voltage rises to approximately 10 kV.

As a result of the switched-mode switch-off and switch-on of the controllable semiconductor switching element, a characteristic which oscillates between 4.5 kV and 9 kV is generated up to time point t=15 ms, wherein the current I is cleared by the counter-voltage of approximately 8 kV within 5 ms (t=15 ms−10 ms). Thereafter, the upper switching threshold for the switched-mode operation of the controllable semiconductor switching element is no longer achieved, as a result of which the controllable semiconductor switching element is permanently switched to a blocking state. In consequence, the system oscillates with the natural resonance. Between t=10 ms and t=15 ms, the current declines from 500 A to 0 A, wherein the current likewise oscillates with the natural resonance.

Figure 5:
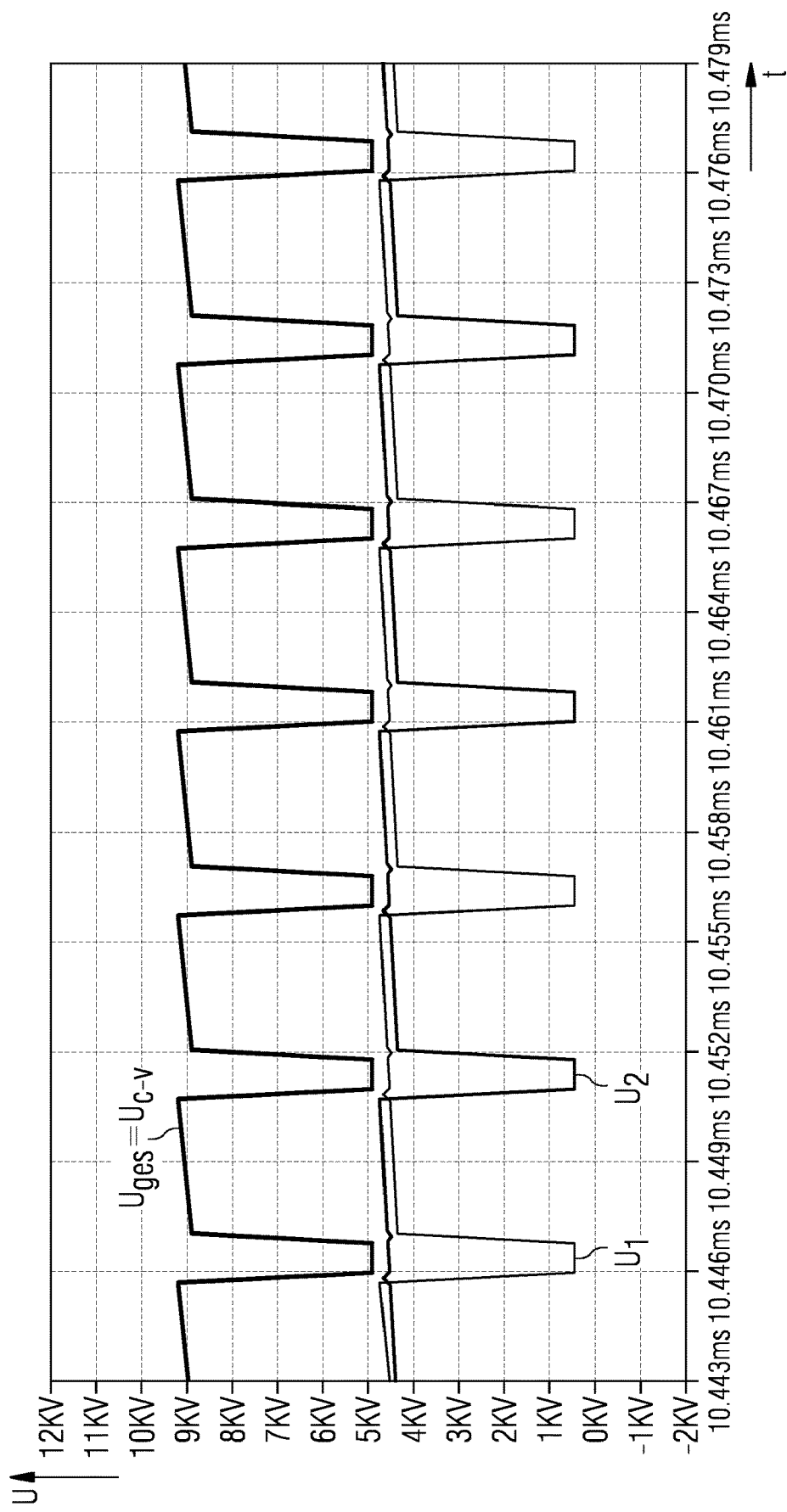
FIG. 5 shows a diagram representing the temporal voltage characteristic across two mutually series-connected switching modules, and the total voltage across the switching device.

FIG. 5 shows a diagram, in which the temporal characteristic of voltages associated with a disconnection process of a switching device 1 having two series-connected switching modules is represented with a higher temporal resolution. The voltage characteristic resulting across the controllable semiconductor switching element of the first switching module is identified as $U_1$, whereas the voltage characteristic resulting across the controllable semiconductor switching element of the second switching module is identified as $U_2$. The resulting overall voltage, which corresponds to the counter-voltage $U_{c\text{-}v}$, is represented by $U_{ges}$. By way of the time segment represented, between 10.443 ms and 10.479 ms, the switched-mode operation of the controllable semiconductor switching elements of both switching modules can clearly be seen. The switched-mode voltage characteristic is also clearly discernible in the overall voltage $U_{ges}$.

Figure 6:
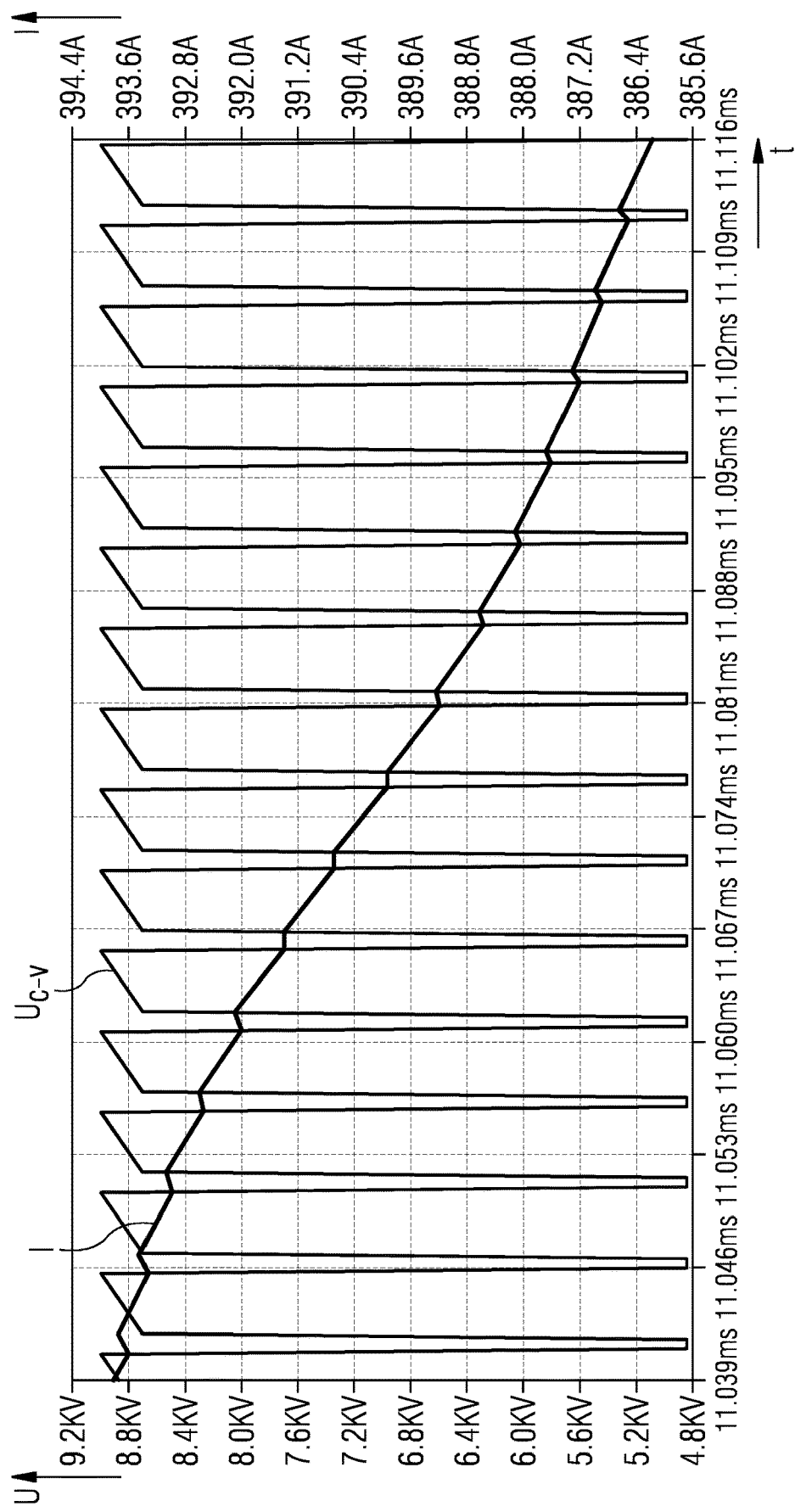
FIG. 6 shows a diagram illustrating the temporal voltage and current characteristic associated with the counter-voltage generated by the switching device incorporating teachings of the present disclosure.

FIG. 6 shows the temporal characteristic of a counter-voltage $U_{c-v}$ generated by the switching device according to the invention, together with the current I flowing in the current path. It can clearly be seen that the switched-mode switch-on and switch-off of the controllable semiconductor switching elements of the switching modules generates a switched-mode counter-voltage $U_{c-v}$, which oscillates between 4.8 kV and 9 kV. In each time segment, in which the counter-voltage $U_{c-v}$ establishes a high counter-voltage with respect to the voltage delivered by the DC voltage source, the current flowing in the current path I declines. In those phases in which the controllable semiconductor switching elements are switched to a conducting state, a build-up of current I occurs once more. As a result of the comparatively shorter duration of the switch-on time, the current declines with a ramped characteristic.

Figure 7:
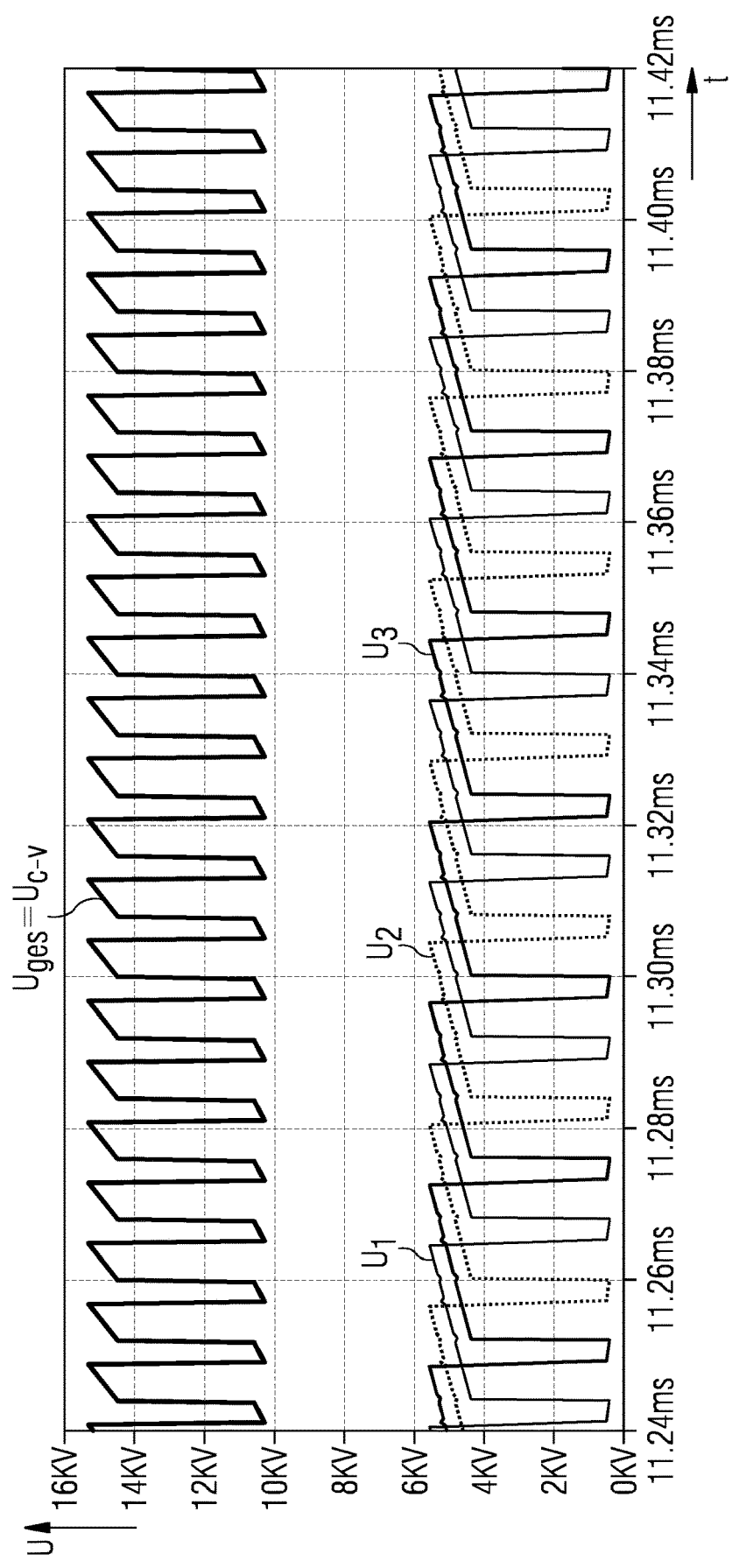
FIG. 7 shows a diagram representing the temporal voltage characteristic of three mutually series-connected switching modules, and the resulting total voltage of the switching device.

FIG. 7 shows the temporal characteristic of the module voltages $U_1$, $U_2$ and $U_3$ of three series-connected switching modules. $U_{ges}$ in turn represents the overall voltage which corresponds to the counter-voltage $U_{c-v}$. From this representation, it can clearly be seen that, at any given time point, at least one controllable semiconductor switching element is switched to a blocking state. It can further be seen that, as a result of the number of n=3 switching modules, the switching voltage, in comparison with a module having only n=2 switching modules (see FIG. 5) is higher. In general, by increasing the number n of switching modules, the switching voltage can be further increased.

Figure 8:
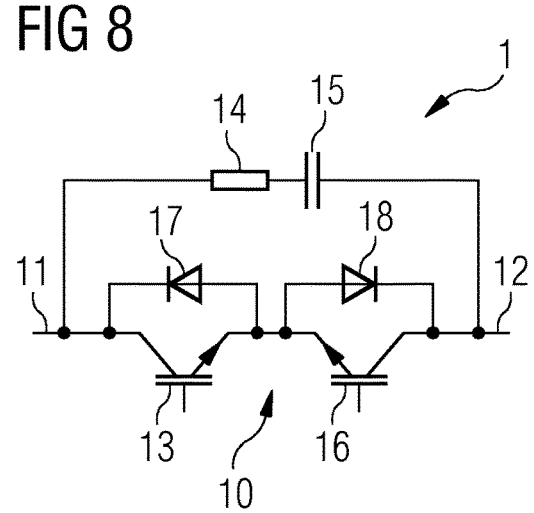
FIG. 8 shows an exemplary embodiment of a bidirectional switching module incorporating teachings of the present disclosure.

FIG. 8 illustrates a modification of the switching module 10 represented in FIG. 1. In addition to the semiconductor switching element 13, a further semiconductor switching element 16 is interconnected in an anti-series arrangement with the controllable semiconductor switching element 13. The controllable semiconductor switching element 13 and the further controllable semiconductor switching element 16 can be of the same type, e.g. IGBTs. The performance of this bidirectionally operable switching module 10 corresponds to the performance of the switching module from FIG. 1. In the bidirectional switching module 10 illustrated in FIG. 8, the current flux can be oriented in both directions. Thus, in the event of conduction, one of the two controllable semiconductor switching elements 13, 16 is switched to a conducting state, and the other is switched to a blocking state. The current flux is maintained via a respective anti-parallel connected diode 17 or 18.

Figure 9:
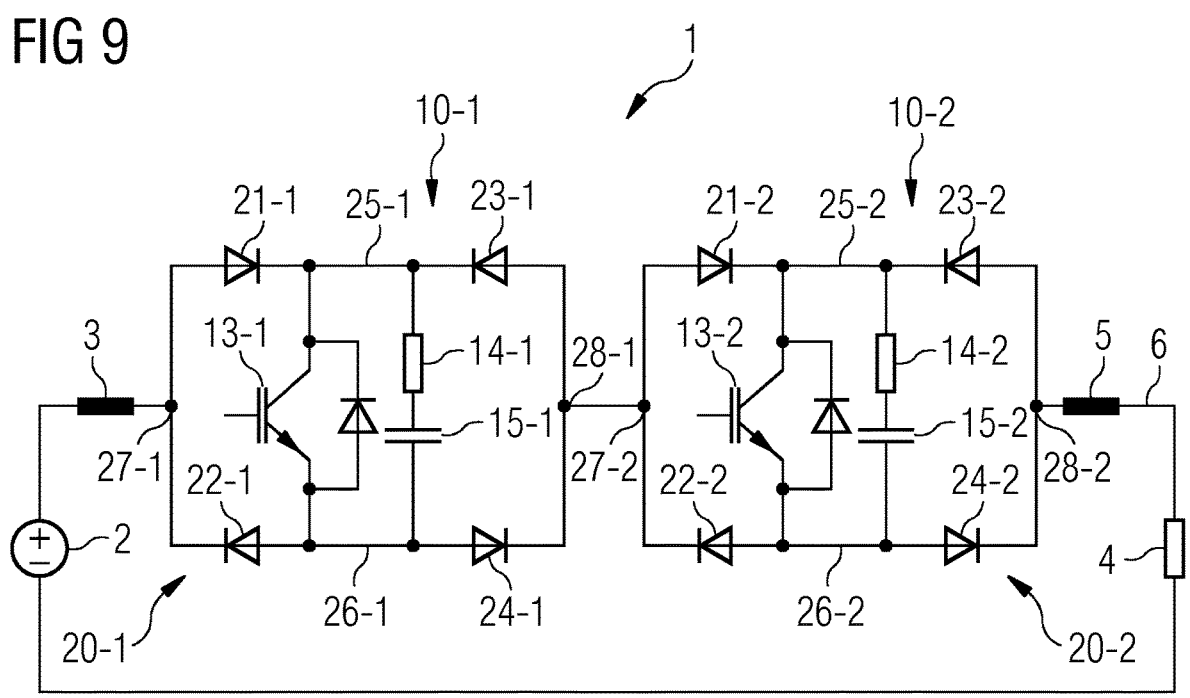
FIG. 9 shows an equivalent electric circuit diagram of a switching device incorporating teachings of the present disclosure in a DC supply system, wherein the switching device is comprised of two modified switching modules having a bridge rectifier.

FIG. 9 shows a further equivalent electric circuit diagram of a switching device 1, wherein the latter, for exemplary purposes, comprises two switching devices 10-1 and 10-2. As in FIG. 3, these are interconnected between a source-end inductance 3 and a load-end inductance 5. The switching modules 10-1 and 10-2 (in general: 10-i, where i=1 to 2) are capable of processing a bidirectional current flux. To this end, a base module of the type represented in FIG. 1 is integrated in a rectifier bridge 20-1 and 20-2 (in general: 20-i, where i=1 to 2). The layout is described with reference to the switching module 10-1, wherein the layout of the switching module 10-2 is identical.

The rectifier bridge 20-1 is realized as a diode bridge with four diodes 21-1, 22-1, 23-1 and 24-1. A first rectifier terminal 25-1 is formed between the cathodes of the diodes 21-1 and 23-1. A second rectifier terminal 26-1 is formed between the anode terminals of the diodes 22-1 and 24-1. The switching module as is laid out in FIG. 1 is interconnected between the first rectifier terminal 25-1 and the second rectifier terminal 26-1. A third rectifier terminal 27-1 is formed between the anode of the diode 21-1 and the cathode of the diode 22-1. The third rectifier terminal 27-1 is connected to the DC voltage source 2 via the source-end inductance 3. A fourth rectifier terminal 28-1 is formed between an anode of the diode 23-1 and a cathode of the diode 24-1. The fourth rectifier terminal 28-1 is interconnected with the first rectifier terminal 27-2 of the second switching module 10-2.

In the rectifier bridge 20-1, a unidirectional base module is thus arranged, wherein the combination thereof constitutes the switching module 10-1. This is employed for both current directions, wherein the current reversal is executed by the components of the rectifier bridge 20-i. In the interests of simplicity, FIG. 9, only the DC voltage source 2 to the left and the load 4 to the right of the switching device 1 are represented. For bidirectional operation, the arrangement comprises a further DC voltage source to the right, and a further load 4 to the left of the switching device 1. As represented in FIG. 9, any desired number of switching modules 10-i can be connected in series.

What is claimed is:

1. A switching device for disconnecting a current path in a DC supply system, said current path comprising inductances at the source end and the load end, the switching device comprising:
   two series-connected switching modules;
   wherein each of the series-connected switching modules comprises two branches connected in parallel;
   a first of the two branches consists of a controllable semiconductor switching element;
   a second of the two branches consists of a resistor and a capacitor connected in series.

2. The switching device as claimed in claim 1, wherein the parallel-connected arrangement of the controllable semiconductor switching element and the series-connected arrangement of the resistor and the capacitor is interconnected between a first switching module terminal and a second switching module terminal of the respective switching module.

3. The switching device as claimed in claim 1, wherein:
   the parallel-connected arrangement of the controllable semiconductor switching element and the series-connected arrangement of the resistor and the capacitor is interconnected between a first rectifier terminal and a second rectifier terminal of a rectifier bridge of the respective switching module;
   the first rectifier terminal comprises a first node point of the rectifier bridge on which the cathode terminals of two rectifier components are mutually interconnected; and
   the second rectifier terminal comprises a second node point of the rectifier bridge on which the anode terminals of two further rectifier components are mutually interconnected.

4. The switching device as claimed in claim 1, wherein, in the operation of the switching device for disconnecting the current path, pending the clearance of the energy stored in the inductances, at a given time point, the controllable semiconductor switching element of at least one of the switching modules is switched to a blocking state.

5. The switching device as claimed in claim 1, wherein, in the operation of the switching device for disconnecting the current path, pending the clearance of the energy stored in the inductances, at a given time point, the controllable semiconductor switching element of a first partial number of switching modules is switched to a blocking state, and a second partial number of switching modules is switched to a conducting state.

6. The switching device as claimed in claim 1, wherein, in the operation of the switching device for disconnecting the current path, pending the clearance of the energy stored in the inductances, the controllable semiconductor switching element of that or those switching module(s) is switched to a conducting state, across the capacitor(s) of which the voltage achieves a predefined upper threshold value.

7. The switching device as claimed in claim 1, wherein, in the operation of the switching device for disconnecting the current path, pending the clearance of the energy stored in the inductances, the controllable semiconductor switching element of that or those switching module(s) is switched to a blocking state, across the capacitor(s) of which the voltage achieves a predefined lower threshold value.

8. The switching device as claimed in claim 1, wherein, in the operation of the switching device for disconnecting the current path, pending the clearance of the energy stored in the inductances, the controllable semiconductor switching element of that or those switching module(s) is permanently switched to a blocking state, if, via the capacitor(s) thereof, the voltage no longer achieves the predefined threshold value.

9. The switching device as claimed in claim 1, wherein, in the operation of the switching device for disconnecting the current path, pending the clearance of the energy stored in the inductances, at a given time point, the controllable semiconductor switching element of the switching module is switched to a conducting state, on the capacitor of which the highest voltage is present, in comparison with the voltages on the capacitors of the remaining switching modules.

10. The switching device as claimed in claim 1, wherein, in the operation of the switching device for disconnecting the current path, pending the clearance of the energy stored in the inductances, the semiconductor switching elements are respectively switched on and off in an alternating manner.

11. The switching device as claimed in claim 1, wherein, in the operation of the switching device for disconnecting the current path, pending the clearance of the energy stored in the inductances, the semiconductor switching elements of different switching modules are switched on and off at different time points.

12. The switching device as claimed in claim 1, wherein, in the path of the controllable semiconductor switching element of a respective switching module, a further controllable semiconductor switching element is interconnected in an anti-series arrangement with the controllable semiconductor switching element.

13. The switching device as claimed in claim 1, wherein the controllable semiconductor switching element comprises at least one interruptible semiconductor switching element selected from the group consisting of: an IGBT, a MOSFET, an IGCT, and a thyristor having a cut-off device.

14. The switching device as claimed in claim 1, wherein the latter is provided for use in a DC supply system having a voltage greater than 1,000 V.

* * * * *